(12) United States Patent
Cheng et al.

(10) Patent No.: US 9,224,811 B2
(45) Date of Patent: Dec. 29, 2015

(54) STACKED SEMICONDUCTOR DEVICE

(71) Applicant: GLOBALFOUNDRIES Inc., Grand Cayman (KY)

(72) Inventors: Kangguo Cheng, Schenectady, NY (US); Ali Khakifirooz, Los Altos, CA (US); Alexander Reznicek, Troy, NY (US); Dominic J. Schepis, Wappingers Falls, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 14/215,398

(22) Filed: Mar. 17, 2014

(65) Prior Publication Data
US 2015/0263088 A1 Sep. 17, 2015

(51) Int. Cl.
| | |
|---|---|
| *H01L 23/48* | (2006.01) |
| *H01L 29/06* | (2006.01) |
| *H01L 29/78* | (2006.01) |
| *H01L 29/66* | (2006.01) |
| *H01L 27/088* | (2006.01) |
| *H01L 21/8234* | (2006.01) |
| *H01L 29/15* | (2006.01) |

(52) U.S. Cl.
CPC .... *H01L 29/0673* (2013.01); *H01L 21/823431* (2013.01); *H01L 27/0886* (2013.01); *H01L 29/155* (2013.01); *H01L 29/66545* (2013.01); *H01L 29/7842* (2013.01); *H01L 29/7851* (2013.01)

(58) Field of Classification Search
CPC . H01L 29/06; H01L 29/0673; H01L 29/7851; H01L 29/66545; H01L 29/7842; H01L 29/155; H01L 27/0886; H01L 21/823431
USPC .................................................. 257/24, 774
See application file for complete search history.

(56) References Cited

U.S. PATENT DOCUMENTS

| | | | |
|---|---|---|---|
| 7,892,945 B2 | 2/2011 | Bedell et al. | |
| 8,216,902 B2 | 7/2012 | Chang et al. | |
| 2012/0138886 A1 | 6/2012 | Kuhn et al. | |
| 2013/0307513 A1* | 11/2013 | Then et al. | 323/311 |
| 2014/0175379 A1* | 6/2014 | Chu-Kung et al. | 257/20 |

FOREIGN PATENT DOCUMENTS

BE  EP1804286 A1  7/2007

OTHER PUBLICATIONS

Buddharaju et al., "Gate-All-Around Si-Nanowire CMOS Inverter Logic Fabricated using Top-down Approach", Proc. of the European Solid-State Device Research Conference, pp. 303-306 (2007).

* cited by examiner

*Primary Examiner* — Shaun Campbell
(74) *Attorney, Agent, or Firm* — David Cain; Andrew M. Calderon; Roberts Mlotkowski Safran & Cole, P.C.

(57) ABSTRACT

A stacked semiconductor device includes a first pair of vertically stacked self-aligned nanowires, a second pair of vertically stacked self-aligned nanowires, and a gate upon a semiconductor substrate, the gate surrounding portions of the first pair of vertically stacked self-aligned nanowires and the second pair of vertically stacked self-aligned nanowires. First epitaxy may merge the first pair of vertically stacked self-aligned nanowires and second epitaxy may merge second pair of vertically stacked self-aligned nanowires. The stacked semiconductor device may be fabricated by forming a lattice-fin upon the semiconductor substrate and the gate surrounding a portion of the lattice-fin. The vertically stacked self-aligned nanowires may be formed by selectively removing a plurality of layers from the lattice-fin.

7 Claims, 11 Drawing Sheets

STACKED SEMICONDUCTOR DEVICE

FIELD

Embodiments of invention generally relate to stacked semiconductor devices, design structures for designing the stacked semiconductor device, and stacked semiconductor device fabrication methods.

BACKGROUND

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3-D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

Device manufacturers are under constant pressure to produce integrated circuit products with increased performance and lower production costs relative to previous device generations. Thus, device designers spend a great amount of time and effort to maximize device performance, while seeking ways to reduce manufacturing costs and improve manufacturing reliability. As it relates to 3D devices, device designers have spent many years and employed a variety of techniques in an effort to improve the performance capability and reliability of such devices.

Stacking FETs have been proposed to increase device density and meet such demands. However, FET stacking approaches usually require complicated processes. For example, separate process modules are needed for building nFETs and building pFETs. In addition, wafer bonding and silicon layer transfer is typically needed after the first type of FETs are formed. Further, alignment of the FETs is extremely challenging.

SUMMARY

In an embodiment of the present invention, a stacked semiconductor device includes a first pair of vertically stacked self-aligned nanowires, a second pair of vertically stacked self-aligned nanowires, and a gate upon a semiconductor substrate, the gate surrounding portions of the first pair of vertically stacked self-aligned nanowires and the second pair of vertically stacked self-aligned nanowires. In certain embodiments, the first pair of vertically stacked self-aligned nanowires are vertically stacked and self-aligned with the second pair of vertically stacked self-aligned nanowires. The stacked semiconductor device may further include first epitaxy surrounding and merging the first pair of vertically stacked self-aligned nanowires and second epitaxy surrounding and merging the second pair of vertically stacked self-aligned nanowires.

In another embodiment of the present invention a stacked semiconductor device fabrication process includes forming a lattice-fin upon a semiconductor substrate, forming a gate upon the semiconductor substrate surrounding a portion of the lattice-fin, and forming vertically stacked self-aligned nanowires by selectively removing a plurality of layers from the lattice-fin. In certain embodiments, the process further includes forming a super-lattice upon the semiconductor substrate, the super-lattice comprising a first layered lattice formed upon the semiconductor substrate, an inter-lattice material formed upon the first layered lattice, and a second layered lattice formed upon the inter-lattice material.

In another embodiment of the present invention, a design structure tangibly embodied in a machine readable medium for designing, manufacturing, or testing a semiconductor device includes one or more embodiments of the stacked semiconductor device.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another.

In general, the present disclosure is directed to forming a stacked semiconductor device, such as a FinFET device, wherein the channel structure is comprised of one or more nanowires. In the example described herein, the channel structure of the device is depicted as being comprised of four illustrative nanowires. However, after a complete reading of the present application, those skilled in the art will appreciate that the channel structure may be comprised of any desired number of such nanowire structures. Thus, the inventions disclosed herein should not be considered as being limited to a device with any particular number of such nanowire structures. Moreover, as will be readily apparent to those skilled in the art upon a complete reading of the present application, the present method is applicable to a variety of devices, including, but not limited to, logic devices, memory devices, etc.

Referring now to the figures, wherein like components are labeled with like numerals, exemplary fabrication steps of forming a semiconductor structure 10 in accordance with embodiments of the present invention are shown, and will now be described in greater detail below. It should be noted that some of the figures depict isometric views of structure 10. Furthermore, it should be noted that while this description may refer to some components of the structure 10 in the singular tense, more than one component may be depicted throughout the figures. However, it is noted that specific elements may be referred to in this description with a numeral and a subscript (e.g. 15*a*, etc.). When those elements are referred to generically, merely the numeral is used (e.g. 15, etc.). The specific number of components depicted in the figures and the isometric orientation was chosen to best illustrate the various embodiments described herein.

Figure 1:
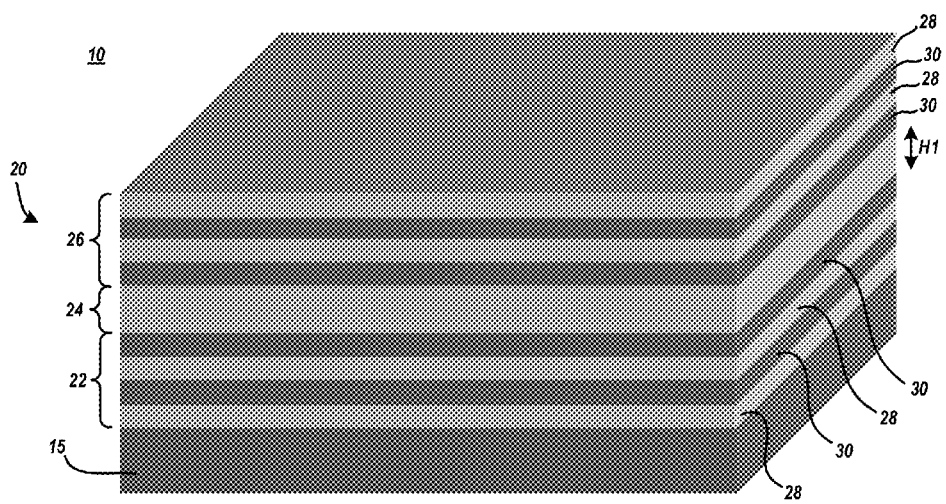
FIG. 1-FIG. 18 depict isometric views of semiconductor structures at intermediate stages of stacked semiconductor device fabrication, in accordance with various embodiments of the present invention.

FIG. 1 depicts an isometric view of semiconductor structure 10 at an intermediate stage of semiconductor device fabrication, in accordance with various embodiments of the present invention. At this stage of fabrication, a super-lattice 20 is formed upon a semiconductor substrate 15.

The semiconductor substrate 15 may include, but is not limited to: any semiconducting material such conventional Si-containing materials, Germanium-containing materials, GaAs, InAs and other like semiconductors. Si-containing materials include, but are not limited to: Si, bulk Si, single crystal Si, polycrystalline Si, SiGe, amorphous Si, semiconductor-on-insulator substrates (SOI), SiGe-on-insulator (SGOI), annealed poly Si, and poly Si line structures.

In various embodiments, substrate 15 may be, for example, a layered substrate 15*a* or a bulk substrate 15*b*. Layered substrate 15*a* may be as Si/SiGe, a silicon-on-insulator (SOI), or a SiGe-on-insulator (SGOI). When the semiconductor substrate 15 is SOI or SGOI substrate, the Si-containing layer atop a buried insulating layer can have a thickness on the order of 30 nm or greater. Bulk semiconductor substrate 15*b* materials may include undoped Si, n-doped Si, p-doped Si, single crystal Si, polycrystalline Si, amorphous Si, Ge, SiGe, SiC, SiGeC, GaAs, InAs, InP, etc. A plurality of fins (not shown) may be etched from the substrate 15*b*.

When layered substrate 15*a* is utilized, it may include a base substrate, a dielectric layer formed on top of the base substrate, and a SOI layer formed on top of the buried dielectric layer. The buried dielectric layer a may isolate the SOI layer from the base substrate. The plurality of fins may be etched from the SOI layer. The base substrate may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the base substrate may be about, but is not limited to, several hundred microns thick. For example, the base substrate may have a thickness ranging from 0.5 mm to about 1.5 mm.

The buried dielectric layer may include any of several dielectric materials, for example, oxides, nitrides and oxynitrides of silicon. The buried dielectric layer may also include oxides, nitrides and oxynitrides of elements other than silicon. In addition, the buried dielectric layer may include crystalline or non-crystalline dielectric material. Moreover, the buried dielectric layer may be formed using any of several known methods, for example, thermal or plasma oxidation or nitridation methods, chemical vapor deposition methods, and physical vapor deposition methods. The buried dielectric layer may have a thickness ranging from about 5 nm to about 200 nm, though less and greater thicknesses have been contemplated. In one embodiment, the buried dielectric layer may have a thickness ranging from about 50 nm to about 150 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate and the SOI layer may include semiconducting materials that have at least different crystallographic orientations. Typically, the SOI layer may include a thickness ranging from about 5 nm to about 100 nm, though less and greater thicknesses have been contemplated. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins may be etched from the SOI layer and they may too include any of the characteristics listed above for the SOI layer.

Super-lattice 20 includes layered lattice 22, inter-lattice material 24, and layered lattice 26. Layered lattice 22 may be formed upon substrate 15, inter-lattice material 24 may be formed upon layered lattice 22, and layered lattice 26 may be formed upon inter-lattice material 24.

In certain embodiments, layered lattice 22 is orientated such that semiconductor layer 28 alternates with semiconductor layer 30 such that semiconductor layer 28 occupies the bottom position and semiconductor layer 30 occupies the top position, relative to substrate 15. In various embodiments, layered lattice 26 is orientated such that semiconductor layer 28 alternates with semiconductor layer 30 such that semiconductor layer 30 occupies the bottom position and semiconductor layer 28 occupies the top position, relative to substrate 15. In other words, layered lattice 22 may have an opposite alternating semiconductor layer orientation relative to layered lattice 26. In certain embodiments, layered lattice 22 and layered lattice 26 may include one or more semiconductor layers 28 and one or more semiconductor layers 30. However, in other embodiments, layered lattice 22 and/or layered lattice 26 may include two or more instances of semiconductor layer 28 and/or two or more instances of semiconductor layer 30. For instance, layered lattice 22 may include a first semiconductor layer 28 formed upon substrate 15, a first semiconductor layer 30 formed upon the first semiconductor layer 28, a second semiconductor layer 28 formed upon the first semiconductor layer 30, and a second semiconductor layer 30 formed upon the second semiconductor layer 28. Similarly, layered lattice 26 may include a first semiconductor layer 30 formed upon inter-lattice material 24, a first semiconductor layer 28 formed upon the first semiconductor layer 30, a second semiconductor layer 30 formed upon the first semiconductor layer 28, and a second semiconductor layer 28 formed upon the second semiconductor layer 30. In certain embodiments, layered lattice 22 and/or layered lattice 26 may include a first instance of semiconductor layer 28 of similar material compared to a second instance of semiconductor layer 28. Likewise, layered lattice 22 and/or layered lattice 26 may include a first instance of semiconductor layer 30 of similar material compared to a second instance of semiconductor layer 30.

The material of semiconductor layer 28 may be selected as to have differing etch properties in relation to the material of semiconductor layer 24. It may be desirable that for certain selective etches the material of semiconductor layer 28 etches at a faster rate than the semiconductor layer 30 material. Such requirements may be satisfied in embodiments of the invention by several different combinations of material selections. Some of the combinations may include: the semiconductor layer 30 being essentially pure Si and the semiconductor layer 28 material being a SiGe alloy with e.g. between 20% and 90% Ge concentration. Or, for example, the semiconductor layer 30 material may essentially be pure Si or SiGe alloy, and the dielectric layer 28 material may be Si:C with e.g. between 1% and 5% carbon (C) concentration. In alternate examples, the semiconductor layer 30 material may be a SiGe alloy and the semiconductor layer 28 material may also be a SiGe alloy, but with a differing Ge concentration than that of the dielectric layer 28 material (i.e. if the Ge concentration differs between the semiconductor layer 30 material and semiconductor layer 28 material by at least 20% it may be sufficient to cause the desired difference in etching rates, etc). In alternate examples, the semiconductor layer 30 material may be a SiGe alloy, and the semiconductor layer 28 material may be Si:C. Or, the semiconductor layer 30 material may be a Si:C, and the semiconductor layer 28 material being a SiGe alloy mixture. In still further examples, the semiconductor layer 30 material may be a SiGe alloy and the semiconductor layer 28 material may be essentially pure Si.

The semiconductor layer 28 and/or semiconductor layer 30 may have a thickness ranging from about 5 nm to about 20 nm, although a thickness less than 5 nm and greater than 20 nm have been contemplated. In embodiments, the semiconductor layer 28 and/or semiconductor layer 30 may be about 10 to 20 nm thick.

Inter-lattice material 24 is a semiconductor layer of similar material to semiconductor layer 28 or similar material to semiconductor layer 30. For example, inter-lattice material 24 may be a similar material to semiconductor layer 28 if semiconductor layer 30 occupies the top position in layered lattice 22 and bottom position in layered lattice 26. Alternatively, inter-lattice material 24 may be a similar material to semiconductor layer 30 if semiconductor layer 28 occupies the top position in layered lattice 22 and bottom position in layered lattice 26. In various embodiments, inter-lattice material 24 is formed upon layered lattice 22 to a thickness H1 that is greater than the thicknesses of semiconductor layer(s) 28 and/or semiconductor layer(s) 30. For instance, inter-lattice material 24 may have a thickness H1 ranging from about 10 nm to about 50 nm, although a thickness less than 10 nm and greater than 50 nm have been contemplated. In embodiments, H1 may be about 20 nm to 40 nm. In various embodiments and as further described herein, inter-lattice material 24 may be replaced with a dielectric to electrically isolate first structure 10 areas (e.g. NMOS areas, nFETs, etc.) from second structure 10 areas (e.g. PMOS areas, pFETs, etc.).

In an exemplary embodiment, substrate 15 is a silicon substrate, semiconductor layer 28 is a SiGe layer, semiconductor layer 30 is a Si layer, and inter-lattice material 24 is a SiGe layer. Inter-lattice material 24, semiconductor layer 28, semiconductor layer 30, etc. may be formed by, for example, depositing the appropriate material with any now known or later developed techniques, including, but not limited to: chemical vapor deposition (CVD), low-pressure CVD (LPCVD), plasma-enhanced CVD (PECVD), semi-atmosphere CVD (SACVD), high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation, etc.

Figure 2:
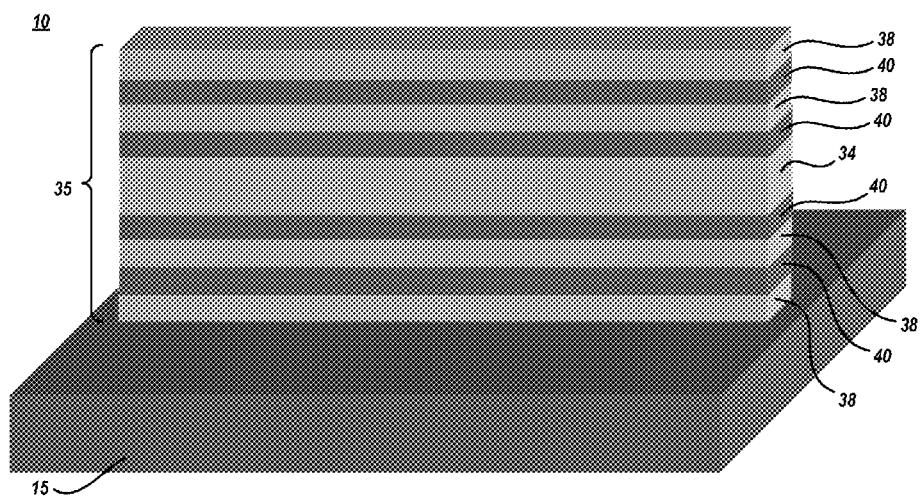

FIG. 2 depicts an isometric view of semiconductor structure 10 at an intermediate stage of semiconductor device fabrication, in accordance with various embodiments of the present invention. At this stage of fabrication lattice-fins 35 are formed.

One or more lattice-fins 35 may be formed from super-lattice 20 utilizing, for example, photolithography and etch processes. For instance, a pattern is produced by applying a masking layer such as a photoresist or photoresist with an underlying hardmask, to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In various embodiments of the invention, lattice-fin 35 includes fin portions 38 retained from semiconductor layers 28, fin portions 40 retained from semiconductor layers 30, and fin portion 34 retained from inter-lattice material layer 24. Generally, lattice-fins 35 may be formed by other known or additional techniques than those described, such as side-wall image transfer (SIT) or directional self-assembly (DSA), without deviating from the spirit of those embodiments herein claimed.

Figure 3:
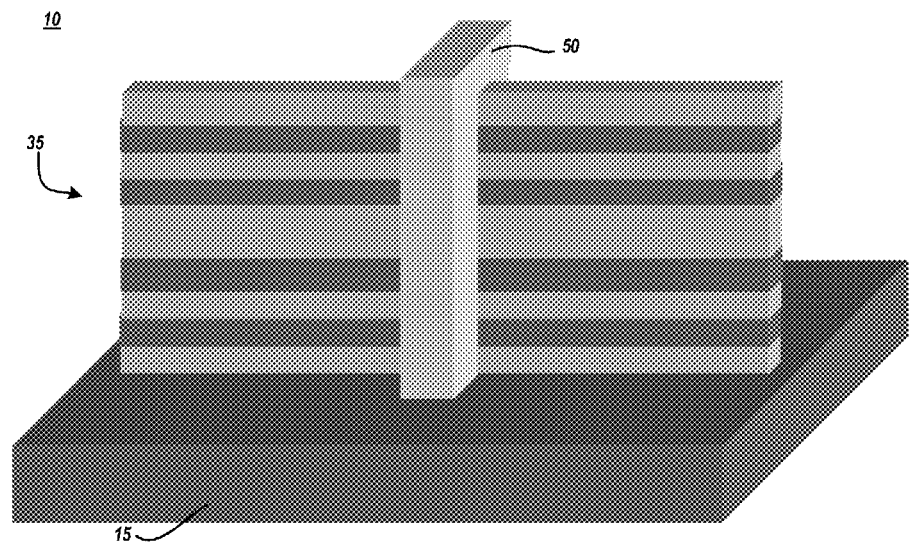

FIG. 3 depicts an isometric view of semiconductor structure 10 at an intermediate stage of semiconductor device fabrication, in accordance with various embodiments of the present invention. At this stage of fabrication, one or more gate structures 50 are formed.

In certain embodiments, gate structures may be temporary (e.g., dummy) gate structure formed on substrate 15. The gate structure 50 may include, for example, a gate stack and spacers. The gate stack may consist of several layers of material above the substrate 15. For example, a gate insulation layer may be formed upon the substrate 15. A gate electrode layer may be formed upon the gate insulation layer. A mask layer may be formed upon the gate electrode layer. Such gate stack layers may be formed using a variety of different materials and by performing a variety of known techniques. For example, the gate insulation layer may be comprised of silicon dioxide, the gate electrode layer may be comprised of polysilicon or amorphous silicon and the mask layer may be comprised of silicon nitride. The gate insulation layer, gate electrode layer and the mask layer may be of any desired thickness or configuration. Moreover, the mask layer could be comprised of multiple layers of material, such as, for example, a combination of a silicon nitride layer and a layer of silicon dioxide. Thus, the particular form and composition of the mask layer and the manner in which it is made should not be considered a limitation of the present invention. The gate stack layer may be formed by any of a variety of different known techniques, e.g., CVD process, ALD process, a thermal growth process, etc.

In certain embodiments, one or more patterning and etching processes are performed to define the gate electrode and the gate cap. Typically, the mask layer is patterned using known photolithography and etching techniques to thereby define a patterned mask layer. Alternatively, the mask layer may be patterned using known sidewall image transfer techniques. Thereafter, one or more etching processes are performed through the patterned mask layer to remove exposed portions of the gate electrode layer to thereby define the gate electrode. In various embodiments, the gate structure 50 surrounds or wraps around a portion of a particular lattice-fin 35 as is schematically depicted in FIG. 3.

The spacers are formed upon the sidewalls the gate stacks. The spacer may be formed by conformally depositing a layer of spacer material and thereafter performing an anisotropic etching process to define the spacers. The spacers may be comprised of a variety of different materials, such as silicon nitride, silicon carbon nitride (SiCN), silicon boron nitride (SiBN), etc. The spacers may have a base thickness of about 5-20 nm.

In embodiments, spacers are made of a different material than used to fabricate the gate stack. For example, the spacers can be made from a silicon nitride material and the gate stack can be made of a polysilicon material. This will permit selective etching of the gate stack and/or spacers in subsequent processing steps. In embodiments, the spacers are deposited on the sides of the gate stack using conventional deposition processes. For example, the spacers may be deposited in two deposition processes in order to accommodate the implantation of source and drain regions. Generally, gate structure(s) 50 may be formed by other known or additional techniques than those described without deviating from the spirit of those embodiments herein claimed.

Figure 4:
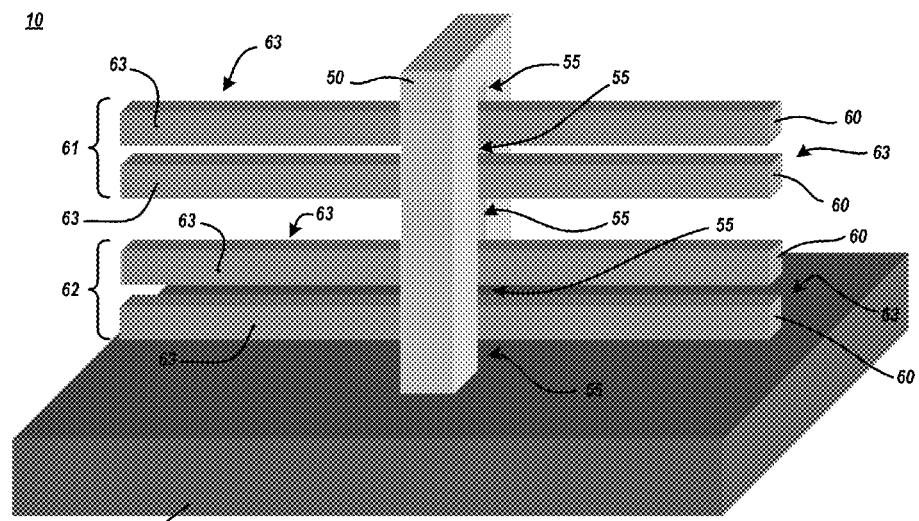

FIG. 4 depicts an isometric view of semiconductor structure 10 at an intermediate stage of semiconductor device fabrication, in accordance with various embodiments of the present invention. At this stage of fabrication self aligned nanowires 60 are formed.

In various embodiments, self aligned nanowires 60 are formed by selectively etching or removing portions (e.g. fin portions 38, fin portion 34, etc.) and retaining portions (e.g. portions 40) from the one or more lattice-fins 35. An example selective etch process includes an RIE that etches SiGe while being selective to reduce the etching of dielectrics such as silicon oxide and silicon nitride as well as being selective to Si. The portions that are etched from the one or more lattice-fins 35 generally within the gate structure 50 region form cavities 55. As such, nanowires 60 may be referred to as floating since cavities 55 exist below the nanowires 60. In other words, there is an absence of underlying material that support the nanowires 60. Rather, nanowires 60 are supported by the surrounding gate structure 50.

The nanowires 60 may have a substantially square-like, rectangular-like, etc. cross-sectional geometry. In certain embodiments, the cross-sectional area of the nanowires 60 may be approximately the same. Nanowires 60 may be referred to as self aligned since alignment processes or techniques are not needed to align individual nanowires 60 within group 61 or within group 62 or to align group 61 with group 62. In various embodiments, nanowire 60 surfaces 63 are coplanar. In various embodiments, nanowires 60 connect to one or more structure 10 active areas. For example, nanowires 60 may electrically connect to the source regions (not shown) on one side of gate structure 50 and connect to drain regions (not shown) on the opposite side of gate structure 50. Generally, nanowires 60 may be formed by other known or additional techniques than those described without deviating from the spirit of those embodiments herein claimed.

Figure 5:
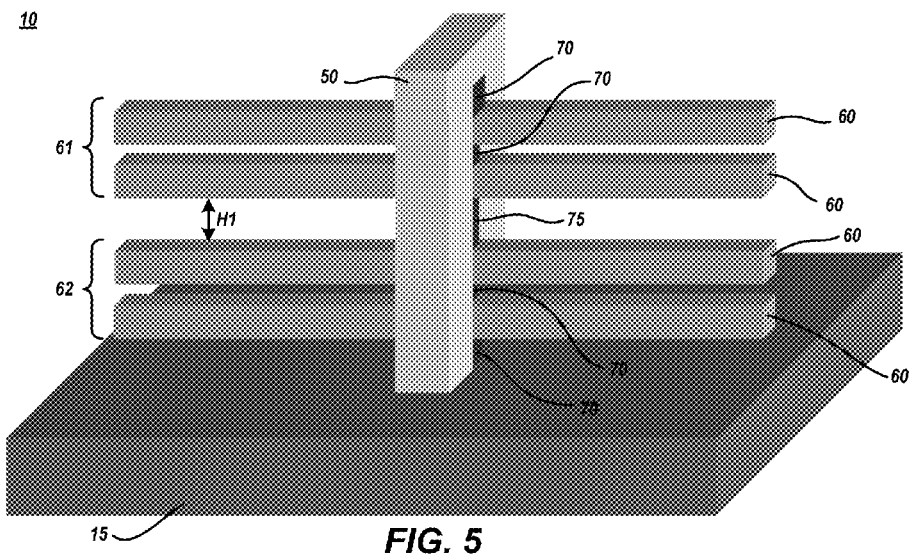

FIG. 5 depicts an isometric view of semiconductor structure 10 at an intermediate stage of semiconductor device fabrication, in accordance with various embodiments of the present invention. At this stage of fabrication dielectric filler 75 and dielectric fillers 70 are formed.

Dielectric fillers 70, 75 are formed from a dielectric material such as oxide, nitride, a low-k material (or a combination thereof) generally within cavities 55 in the gate structure 50 region. Dielectric fillers 70 fill cavities 55 within nanowire group 61 or nanowire 62, whereas dielectric filler 75 fills cavity 55 between nanowire group 61 and group 62. Dielectric filler 75 may be formed to the height H1 that is greater than the height of dielectric fillers 70 to more effectively electrically isolate nanowire group 61 from nanowire group 62. In alternate embodiments, dielectric fillers 70, 75 may be geometrically similar. In various embodiments, dielectric fillers 70, 75 may be formed to completely fill cavity 55 such that the side surfaces of fillers 70, 75 are coplanar with side surfaces of gate structure 50 and top and bottom surfaces of fillers 70, 75 are coincident with applicable underlying or overhead surfaces, respectively.

Dielectric fillers 70, 75 may be formed by, for example, depositing the appropriate material with any now known or later developed techniques, including, but not limited to: chemical vapor deposition (CVD), low-pressure CVD (LPCVD), plasma-enhanced CVD (PECVD), semi-atmosphere CVD (SACVD), high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation, etc. Portions of the dielectric filler material that is deposited outside the cavity 55 are removed by, for example, a wet etch process. During this etch process portions of the dielectric filler material that is formed in the cavity 55 are protected by the gate structure 50.

The low-k material may be a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof.

Figure 6:
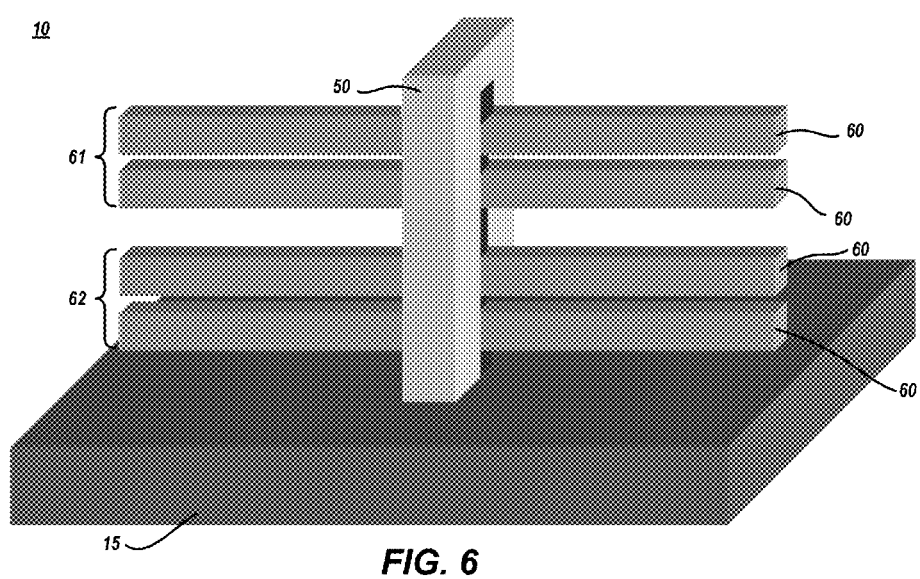

FIG. 6 depicts an isometric view of semiconductor structure 10 at an intermediate stage of semiconductor device fabrication, in accordance with various embodiments of the present invention. At this stage of fabrication nanowires 60 may be thickened.

Depending upon the specific techniques utilized to form dielectric fillers 70, 75, it may be desirable to thicken the diameter, dimensions, etc. of nanowires 60. For example, if a thermal oxidation process is utilized to form dielectric fillers 70, 75, there may be a minimal loss of nanowire 60 material. To thicken nanowires 60, a selective epitaxial growth from the exposed portions the nanowires 60 generally outside the gate structure 50 region may be utilized. The nanowires 60 may be thickened by epitaxially growing, for example, Si, with intrinsic or undoped materials. In an alternate embodiment, the nanowires 60 may be thickened by growth of in situ dopants that may be either n-type or p-type, as applicable. As an example, a CVD reactor may be used to perform the epitaxial growth. Precursors for silicon epitaxy include SiCl4, SiH4 combined with HCl. The use of chlorine allows selective deposition of Si only on exposed Si surfaces. Precursors for dopants may include PH3 or AsH3 for n-type doping and B2H6 for p-type doping. Deposition temperatures may range from 550° C. to 1000° C. for pure silicon deposition, and as low as 300° C. for pure Ge deposition. Generally, nanowires 60 may be thickened by other known or additional techniques than those described without deviating from the spirit of those embodiments herein claimed.

Figure 7:
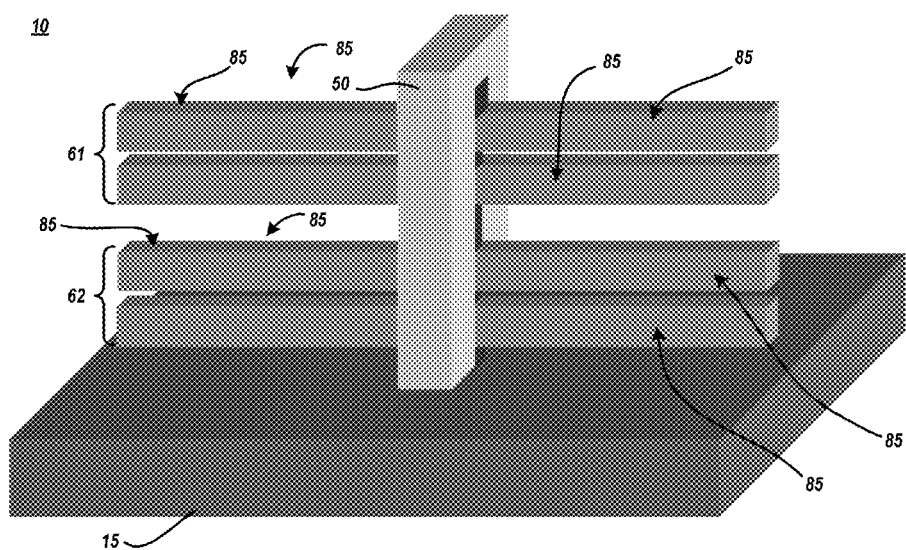

FIG. 7 depicts an isometric view of semiconductor structure 10 at an intermediate stage of semiconductor device fabrication, in accordance with various embodiments of the present invention. At this stage of fabrication oxidized surfaces 85 are formed upon nanowires 60.

In various embodiments, nanowires 60 are oxidized, forming an oxidized perimeter upon the exposed surfaces referred to as oxidized surfaces 85. This oxidation consumes some of the Si from the nanowires 60 by transforming the silicon into silicon dioxide (also referred to herein as a thermal oxide). According to an exemplary embodiment, oxidation is carried out in the presence of an oxidizing gas to oxidize the silicon in the nanowires 60. For example, rapid thermal oxidation (also referred to herein as rapid thermal processing or RTP) at a temperature of greater than about 800° C., e.g., from about 900° C. to about 1250° C. may oxidize a desired amount of material (for example, for a duration of up to about 24 hours, e.g., from about 10 seconds to about 60 minutes) may be used to achieve the oxidation of nanowires 60. The amount of material to be oxidized is dependent on a starting size and final desired size of the nanowires 60. By way of example only, if the starting diameter of each nanowire is 25 nanometers (nm) and the final desired diameter of each nanowire is 10 nm, then the removal of 7.5 nm of silicon by oxidation would be desirable. Rapid thermal oxidation for such short durations requires RTP in an oxidizing environment (such as pure oxygen, nitrous oxide or water vapor) at a pressure of from about one millitorr (mTorr) to about 100 atmospheres (atm). Generally, nanowires 60 may be oxidized by other known or additional techniques than those described without deviating from the spirit of those embodiments herein claimed.

Figure 8:
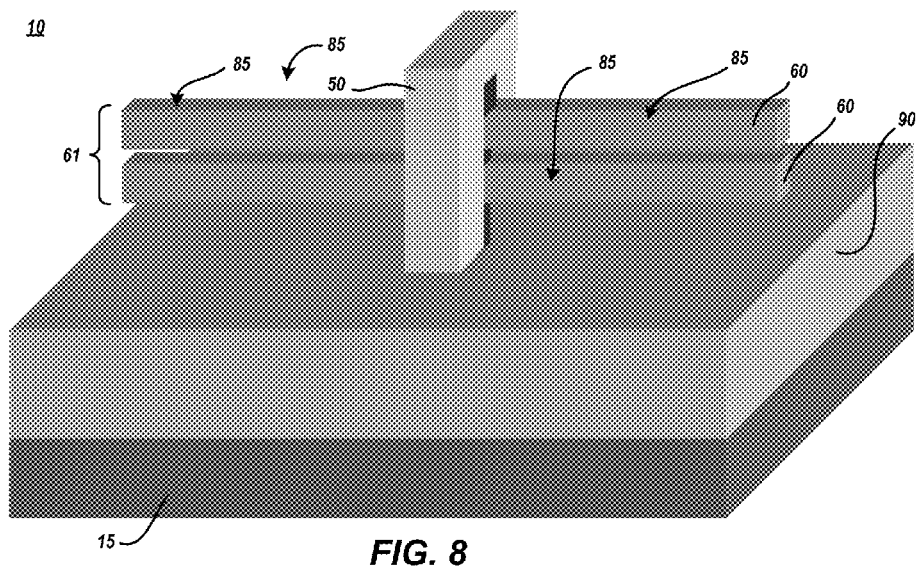

FIG. 8 depicts an isometric view of semiconductor structure 10 at an intermediate stage of semiconductor device fabrication, in accordance with various embodiments of the present invention. At this stage of fabrication, layer 90 may be formed.

Layer 90 may include, but not limited to, OPL (organic planarizing layer), IPL (inorganic planarizing layer), ARC (anti-reflection coating) or combinations thereof. Layer 90 may be formed upon the semiconductor substrate 15 and around nanowire 60 group 62. Layer 90 may be any organic material including, but not limited to, a near-frictionless carbon (NFC) material, and a polyimide, an inorganic material, or an anti-reflection material. Layer 90 can be formed utilizing a deposition process such as, for example, spin-on, CVD, PECVD, evaporation, chemical solution deposition and other like deposition techniques. In certain embodiments, layer 90 may be formed to a thickness greater than the height of group 62, etc. Still in other embodiments, layer 90 may be formed to a thickness to cover all nanowires 60. CMP, grinding, recess etch, etc. can be used to recess and/or planarize the deposited layer 90 to expose nanowire 60 group 61. The layer 90 may have a thickness ranging from about 50 nm to about 500 nm, although a thickness less than 50 nm and greater than 500 nm have been contemplated. In embodiments, the layer 90 may be about 100 to 300 nm thick. In various embodiments, layer 90 protects nanowire 60 group 62 from subsequent fabrication processes. Generally, nanowire 60 group 62 may be protected by other known or additional materials or techniques than those described without deviating from the spirit of those embodiments herein claimed.

Figure 9:
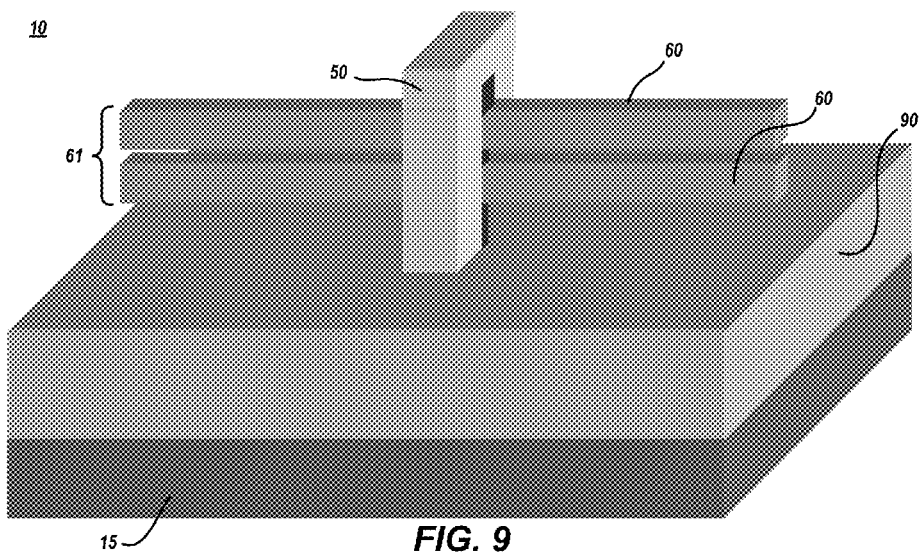

FIG. 9 depicts an isometric view of semiconductor structure 10 at an intermediate stage of semiconductor device fabrication, in accordance with various embodiments of the present invention. At this stage of fabrication the oxidized surfaces 85 of group 61 nanowires 60 are removed using any suitable etching technique such as dry etch, wet etch, or combination of both. The oxidized surfaces 85 of group 61 nanowires 60 may be removed by, for example, a dry etch, such as SICONI (in situ cleaning) or COR (chemical oxide removal). The SICONI etch is generally conformal and selective towards silicon oxide layers but does not readily etch silicon regardless of whether the silicon is amorphous, crystalline or polycrystalline. COR also selectively removes silicon oxides by reacting gaseous ammonia ($NH_3$) and hydrogen fluoride (HF) to produce $NH_4F_x$. The $NH_3$ and HF react with silicon oxide to form ammonium hexafluorosilicate. Structure 10 may then transferred to a different chamber and heated, producing nitrogen, water, silicon tetrafluoride, and $NH_3$, which are volatile and evaporate. Generally, oxidized surfaces 85 of group 61 nanowires 60 may be removed by other known or additional materials or techniques than those described without deviating from the spirit of those embodiments herein claimed.

Figure 10:
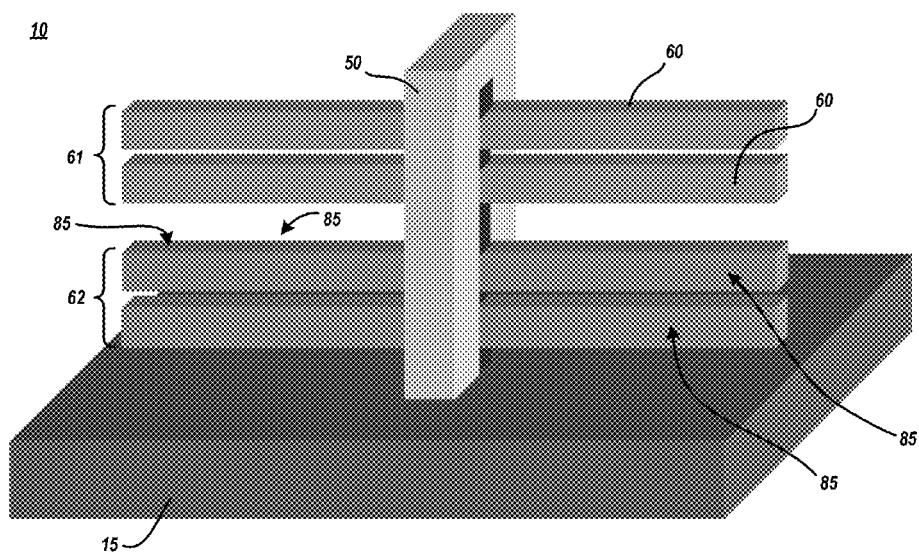

FIG. 10 depicts an isometric view of semiconductor structure 10 at an intermediate stage of semiconductor device fabrication, in accordance with various embodiments of the present invention. At this stage of fabrication layer 90 is removed using any suitable etching technique such as dry etch, wet etch, or combination of both. In particular embodiments, substrate 15, nanowire 60 group 61, portion of gate structure 50, etc. are revealed using an isotropic oxide wet etch timed to remove layer 90. For clarity, at the present stage of fabrication the nanowires 60 in group 61 do not include oxide perimeter 85 and the nanowires 60 in group 62 do comprise oxide perimeter 85. Layer 90 may be removed by other known or additional techniques than those described without deviating from the spirit of those embodiments herein claimed.

Figure 11:
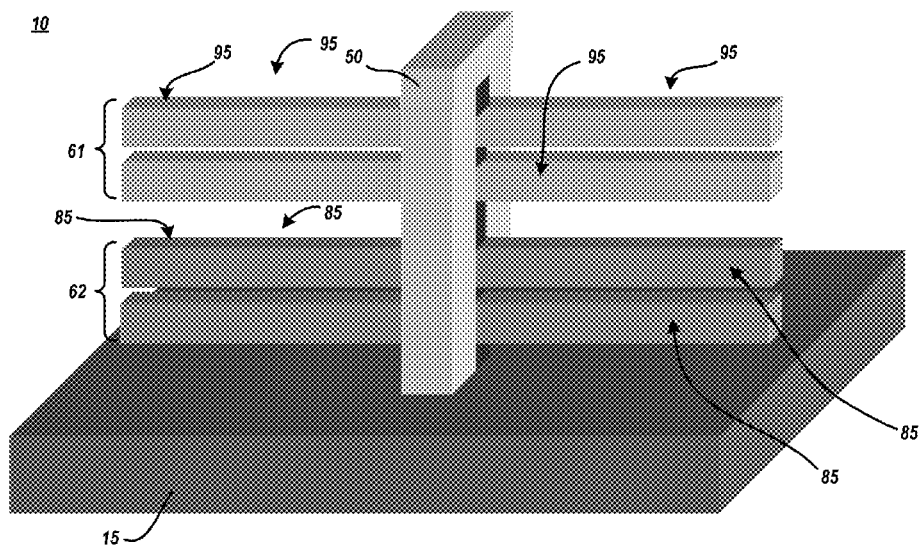

FIG. 11 depicts an isometric view of semiconductor structure 10 at an intermediate stage of semiconductor device fabrication, in accordance with various embodiments of the present invention. At this stage of fabrication a nitrided surface 95 is formed upon nanowires 60 in group 61. In various embodiments, nitrided surface 95 may formed upon group 61 nanowires 60 by nitridation processes, in which a nitrogen enriched perimeter is formed within exposed group 61 nanowires 60. Nitrided surfaces 95 of group 61 nanowires 60 have a higher nitrogen content after performing the nitridation process as compared to the original nanowire 60 material.

The nitridation process used in forming the nitrided surfaces 95 may be a thermal nitridation process. In various embodiments, nitrided surfaces 95 protect group 61 nanowires 60 from subsequent fabrication techniques. When a thermal nitridation process is employed, no damage to oxidized surface 85/group 62 nanowires 60, gate structure 50, dielectric fillers 70, 75, etc. is observed. The thermal nitridation process may be performed in any nitrogen-containing ambient. The nitrogen-containing ambients that can be employed in the present disclosure include, but are not limited to, N2, NH3, NH4, NO, and NHx wherein x is between 0 and 1. Mixtures of the aforementioned nitrogen-containing ambients can also be employed. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, H2 can be used to dilute the nitrogen-containing ambient. Notwithstanding whether the nitrogen-containing ambient is employed neat or diluted, the content of nitrogen within the nitrogen-containing ambient employed in the present disclosure is typically from 10% to 100%, with a nitrogen content within the nitrogen-containing ambient from 50% to 80% being more typical.

In one embodiment, the thermal nitridation process employed in the present disclosure is performed at a temperature from 50° C. to 450° C. In another embodiment, the thermal nitridation process employed in the present disclosure is performed at a temperature from 100° C. to 300° C.

In addition to a thermal nitridation process, the formation of nitrided surfaces 95 can include a plasma nitridation process. When a plasma nitridation process is employed, an electrical bias of about 200 W or greater can be employed. The plasma nitridation process is performed by generating a plasma from one of the nitrogen-containing ambients that is mentioned above for the thermal nitridation process. In one embodiment, the plasma nitridation process employed in the present disclosure is performed at a temperature from 50° C. to 450° C. In another embodiment, the plasma nitridation process employed in the present disclosure is performed at a temperature from 100° C. to 300° C.

Notwithstanding the type of nitridation employed, the depth of the nitrided surfaces 95 may vary. Typically, the depth of the nitrided surfaces 95 as measured from the outer most exposed surfaces of group 61 nanowires 60 inward, is from 0.5 nm to 20 nm, with a depth from 1 nm to 10 nm being more typical. Nitrided surfaces 95 may be formed by other known or additional techniques than those described without deviating from the spirit of those embodiments herein claimed.

Figure 12:
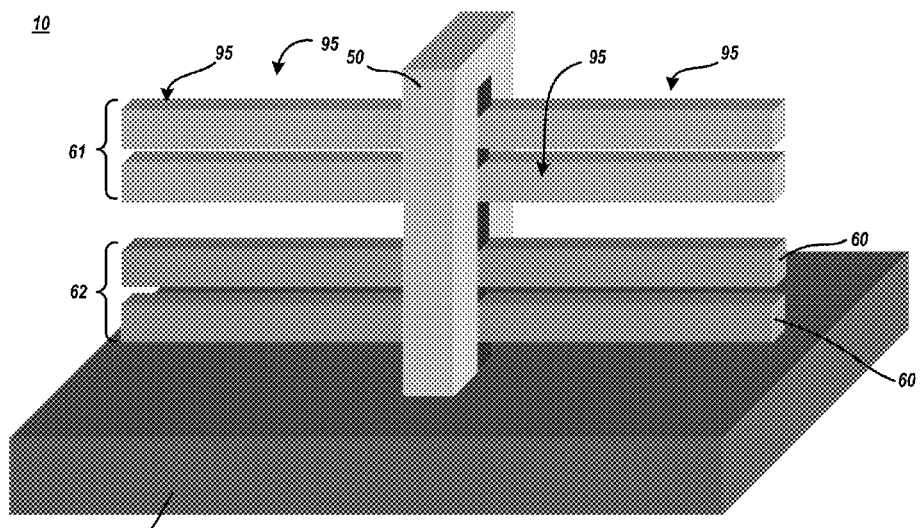

FIG. 12 depicts an isometric view of semiconductor structure 10 at an intermediate stage of semiconductor device fabrication, in accordance with various embodiments of the present invention. At this stage of fabrication the oxidized surfaces 85 of group 62 nanowires 60 are removed using any suitable etching technique such as dry etch, wet etch, or combination of both. In certain embodiments, oxidized surfaces 85 of group 62 nanowires 60 may be selectively removed by, for example, SICONI cleaning or COR. Though generally, oxidized surfaces 85 of group 62 nanowires 60 may be selectively removed from the nanowires 60 of group 61 by other known or additional materials or techniques than those described without deviating from the spirit of those embodiments herein claimed.

Figure 13:
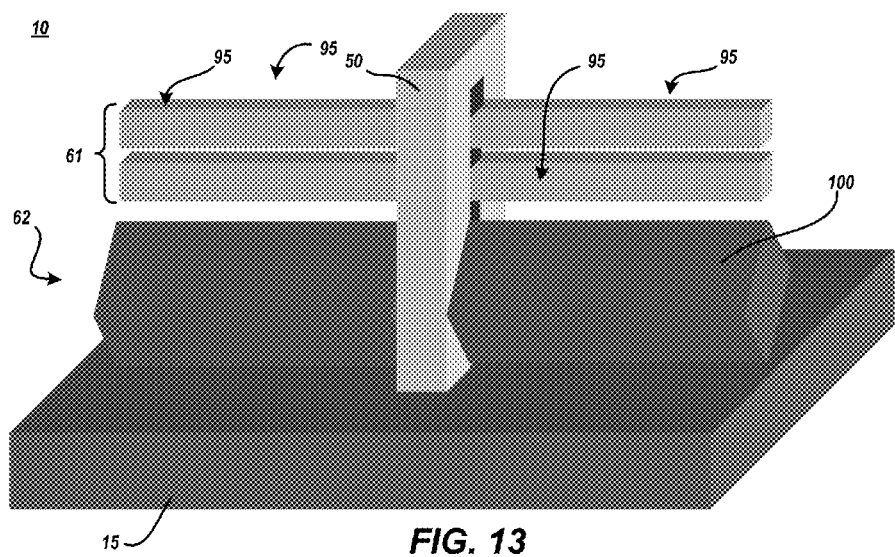

FIG. 13 depicts an isometric view of semiconductor structure 10 at an intermediate stage of semiconductor device fabrication, in accordance with various embodiments of the present invention. At this stage of fabrication epitaxy 100 is formed upon group 62 nanowires 60.

Generally, expitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on silicon surfaces, and do not deposit material on dielectric surfaces, such as silicon dioxide or silicon nitride surfaces.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc.

Generally, epitaxy growth is quickest from <100> planes and is slowest from <111> planes. Epitaxy 100 may be grown from group 62 nanowires 60 sidewalls 63 and a <111> bound diamond epitaxy 100 structure is formed surrounding and merging group 62 nanowires 60. As shown in FIG. 13, substrate 15 has a <100> orientation and group 62 nanowires 60 sidewalls 63 have a <110> orientation. A non limiting list of exemplary expitaxial materials are: silicon germanium alloy (SiGe), Silicon (Si), in-situ boron doped SiGe or Si, in situ phosphorus or arsenic doped Si or SiGe, with doping levels ranging from 1e19 to 1.5e21, with 4-9e20 dopant levels preferred.

Figure 14:
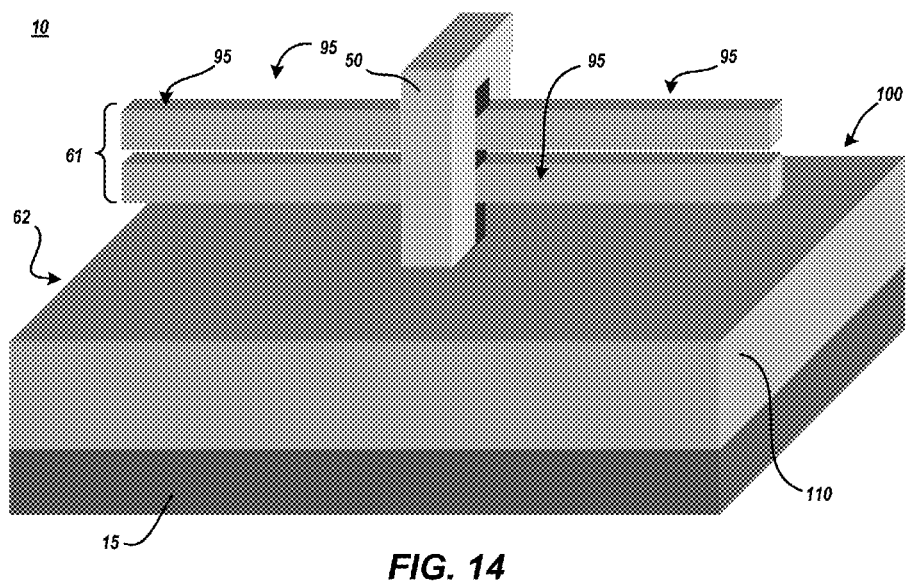

FIG. 14 depicts an isometric view of semiconductor structure 10 at an intermediate stage of semiconductor device fabrication, in accordance with various embodiments of the present invention. At this stage of fabrication layer 110 is formed.

Layer 110 may be a dielectric material formed upon the semiconductor substrate 15 and around epitaxy 110, etc. For example, layer 110 may be an oxide. Layer 110 can be formed utilizing a deposition process such as, for example, spin-on, CVD, PECVD, evaporation, chemical solution deposition and other like deposition techniques. In certain embodiments, layer 110 may be formed to a thickness greater than the height of epitaxy 100, etc. Still in other embodiments, layer 110 may be formed to a thickness to cover group 61 nanowires 60. CMP, grinding, or a recess etch, etc. can be used to recess and/or planarize the deposited layer 110 to expose nanowire 60 group 61 whilst coving epitaxy 100 group 62 nanowires 60, etc. The layer 110 may have a thickness ranging from about 50 nm to about 500 nm, although a thickness less than 50 nm and greater than 500 nm have been contemplated. In embodiments, the layer 110 may be about 150 to 300 nm thick. In various embodiments, layer 110 protects epitaxy 100 from subsequent fabrication processes. In certain embodiments, layer 110 may be an oxide layer formed by HDPCVD to achieve desirable etch characteristics. Generally, epitaxy 100, etc. may be protected by other known or additional materials or techniques than those described without deviating from the spirit of those embodiments herein claimed.

Figure 15:
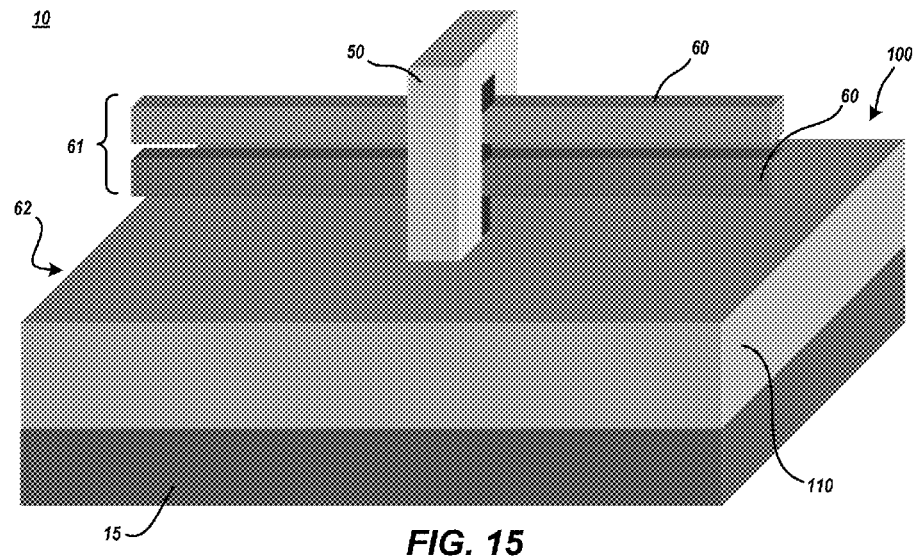

FIG. 15 depicts an isometric view of semiconductor structure 10 at an intermediate stage of semiconductor device fabrication, in accordance with various embodiments of the present invention. At this stage of fabrication the nitrided surfaces 95 of group 61 nanowires 60 are removed using any suitable etching technique such as dry etch, wet etch, or combination of both. In certain embodiments, nitrided surfaces 95 of group 61 nanowires 60 may be selectively removed by, for example, a selective etch technique utilizing a Frontier Chamber manufactured by Applied Materials®. Nitrided surfaces 95 of group 61 nanowires 60 may be selectively removed by other known or additional materials or techniques than those described without deviating from the spirit of those embodiments herein claimed.

Figure 16:
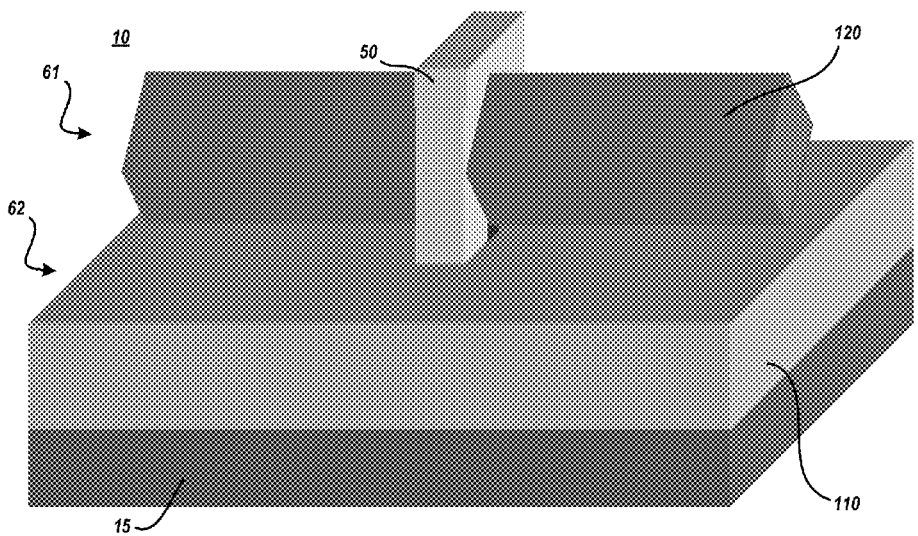

FIG. 16 depicts an isometric view of semiconductor structure 10 at an intermediate stage of semiconductor device fabrication, in accordance with various embodiments of the present invention. At this stage of fabrication epitaxy 120 is formed upon group 61 nanowires 60.

Epitaxy 120 may be formed by epitaxial growth from group 61 nanowires 60 sidewalls 63. When epitaxy growth from group 61 nanowires 60 sidewalls 63 is complete, a <111> bound diamond epitaxy 120 structure is formed surrounding and merging group 61 nanowires 60. A non limiting list of exemplary expitaxial materials are: silicon germanium alloy (SiGe), Silicon (Si), in-situ boron doped SiGe or Si, in situ phosphorus or arsenic doped Si or SiGe, with doping levels ranging from 1e19 to 1.5e21, with 4-9e20 dopant levels preferred.

Figure 17:
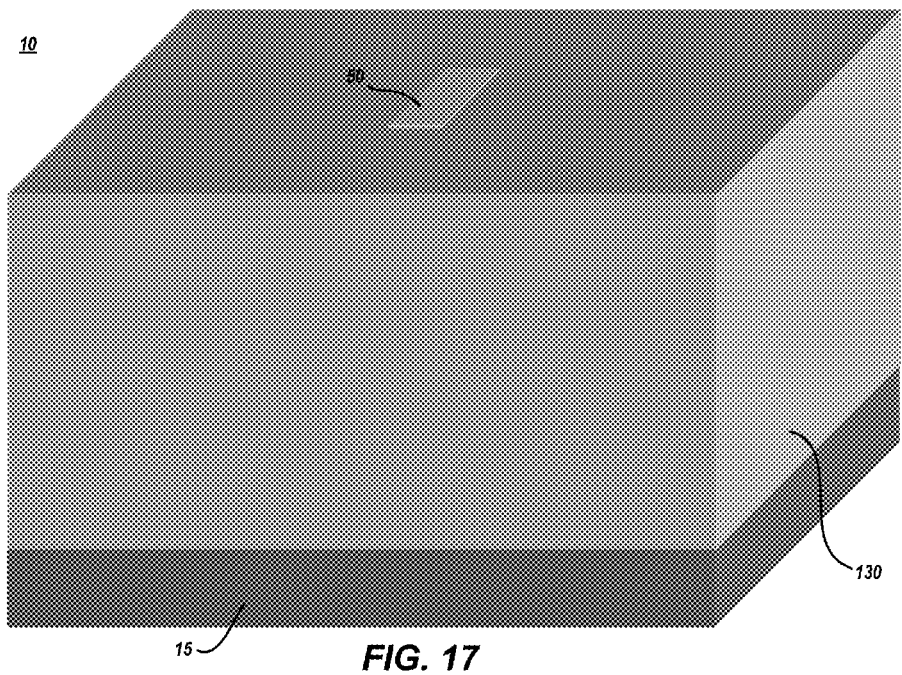

FIG. 17 depicts an isometric view of semiconductor structure 10 at an intermediate stage of semiconductor device fabrication, in accordance with various embodiments of the present invention. At this stage of fabrication layer 130 is formed.

Figure 18:
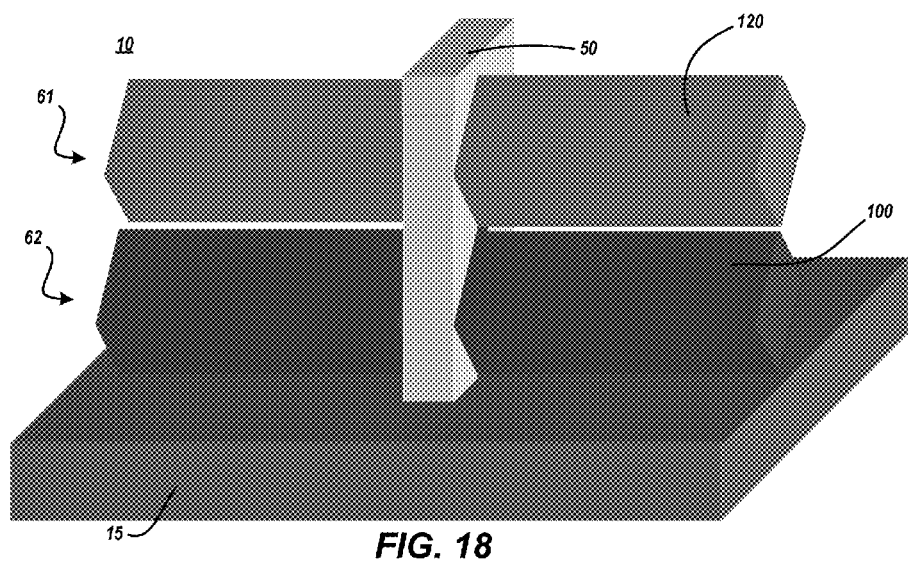

Layer 130 may be a dielectric material formed upon the layer 110. In certain embodiments, layer 110 and layer 130 combine to form an apparent singular layer. Layer 130 may be an oxide and can be formed utilizing a deposition process such as, for example, spin-on, CVD, PECVD, evaporation, chemical solution deposition and other like deposition techniques. In certain embodiments, layer 130 may be formed to a thickness such that the top of layer 130 is coplanar with the height of gate structure 50, etc. Still in other embodiments, layer 130 may be formed to a thickness to cover gate structure 50. CMP, grinding, or a recess etch, etc. can be used to recess and/or planarize the deposited layer 130 to expose the top surface of gate structure 50 whilst coving epitaxy 100, epitaxy 120, etc. In certain embodiments, layer 130 may be a flowable oxide layer, and oxide layer formed by HDPCVD to achieve desirable etch characteristics. In various embodiments, structure 10 may undergo subsequent semiconductor device fabrication stages. For example, structure 10 as shown in FIG. 17 may undergo subsequent "gate last" fabrication stages, such as gate formation where gate structure(s) 50 is a dummy gate and replaced. If gate structure(s) 50 are associated with gate first techniques, structure 10 as shown in FIG. 17 may undergo subsequent front end of the line, middle of the line, back end of the line fabrication stages, to form a semiconductor device. FIG. 18 depicts structure 10 at the similar stage of fabrication as shown in FIG. 17 with layer 130 and layer 110 or the combined layer 130 removed.

In the various embodiments of the present invention, the nanowires 60 in group 61, epitaxy 100, etc. may be formed as a nFET structure and the nanowires 60 in group 62, epitaxy 120 may be formed as pFET structure. Alternatively, the nanowires 60 in group 61, epitaxy 100, etc. may be formed as a pFET structure and the nanowires 60 in group 62, epitaxy 120 may be formed as nFET structure.

In the various embodiments of the present invention, the nanowires 60 in groups 61 and the nanowires in groups 62 are formed as FET structures (e.g. nFETs, pFETS) without separate process modules and without wafer bonding or silicon layer transfer after the first type of FETs are formed. Further, the nanowires 60 in groups 61 and the nanowires in groups 62 may be self-aligned. Thus, the various embodiments of the present invention provide a stacked semiconductor device without the drawbacks of the related art.

Figure 19:
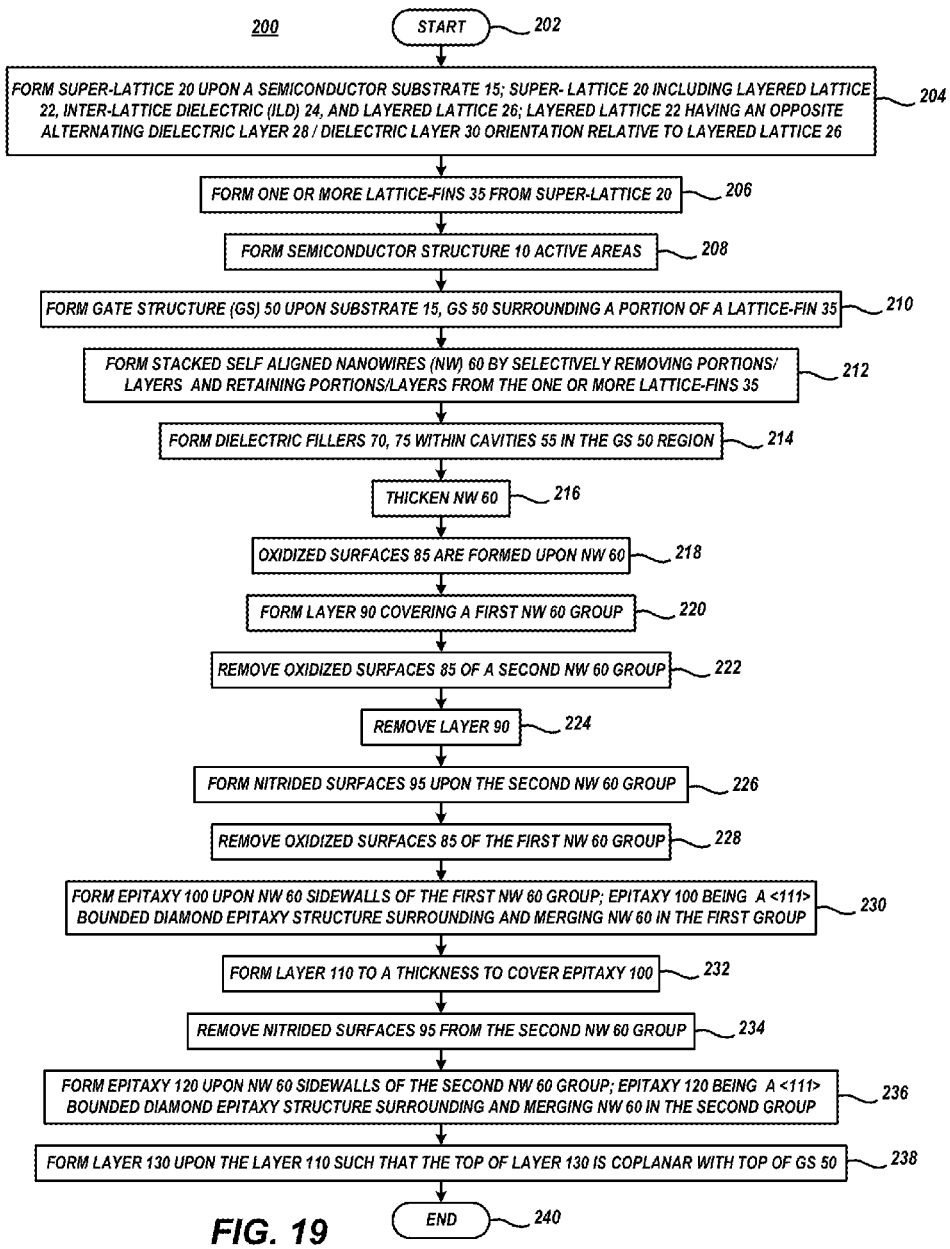
FIG. 19 depicts an exemplary stacked semiconductor device fabrication process flow method, in accordance with various embodiments of the present invention.

FIG. 19 depicts an exemplary process flow method 200 for manufacturing a stacked semiconductor device, in accordance with various embodiments of the present invention. Method 200 begins at block 202 and continues by forming super-lattice 20 upon semiconductor substrate 15 (block 204). Super-lattice 20 may include layered lattice 22, inter-lattice material 24, and layered lattice 26. Layered lattice 22 and layered lattice 26 may include oppositely orientated alternating layers of semiconductor layer 28 and semiconductor layer 30.

Method 200 may continue by forming one or more lattice-fins 35 from super-lattice 20 (block 206). For example, a lattice-fin 35 may include fin portions 38 retained from semiconductor layers 28, fin portions 40 retained from semiconductor layers 30, and fin portion 34 retained from inter-lattice material 24. Method 200 may continue by forming one or more semiconductor structure 10 active areas (block 208).

For example source and drain regions may be formed upon/within structure 10 generally, for example, on opposing ends of lattice fins 35.

Method 200 may continue by forming one or more gate structures 50 upon substrate 15 (block 210). The gate structure 50 may be a dummy gate structure utilized in gate last fabrication processes or may be a gate structure utilized in gate first fabrication processes. Each gate structure 50 may generally surround a portion of a particular lattice fin 35.

Method 200 may continue by forming one or more nanowires 60 (block 212). The nanowires 60 may be formed by selectively etching or removing e.g. fin portions 38, fin portion 34, etc. and retaining e.g. portions 40 from the one or more lattice-fins 35. The portions that are removed generally within the gate structure 50 region form cavities 55. The nanowires 60 may be referred to as floating since cavities 55 exist below the nanowires 60—there is an absence of underlying material that support the nanowires 60. Rather, nanowires 60 are supported by the surrounding gate structure 50. Nanowires 60 may be self aligned since alignment processes or techniques are not needed to align individual nanowires 60 within group 61 or within group 62 or to align group 61 with group 62. In various embodiments, nanowire 60 front and rear surfaces are generally coplanar. The nanowires 60 may electrically connect to one or more structure 10 active areas. For example, nanowires 60 may electrically connect to the source regions on one side of gate structure 50 and connect to drain regions on the opposite side of gate structure 50. The nanowires 60 may be generally vertically stacked wherein e.g. a first and second nanowire in group 61 may have a vertical alignment and e.g. a first and second nanowire in group 62 may have a vertical alignment. Further, the nanowires 60 in group 61 and the nanowires in group 62 may also have a vertical alignment.

Method 200 may continue by filling cavities 55 within the gate structure 50 region with dialectic fillers 70, 75 (block 214). Method 200 may continue with thickening nanowires 60 outside of the gate structure 50 region (block 216). Method 200 may continue with forming oxidized surfaces 85 upon perimeter surfaces of nanowires 60 (block 218). For example, a thermal oxidation process may be utilized to form the oxidized surfaces 85.

Method 200 may continue by forming layer 90 such that layer 90 covers the nanowires 60 in group 62 (block 220). In the present stage of fabrication, layer 90 need not cover the nanowires 60 in group 61. Method 200 may continue by removing the oxidized surfaces 85 from the nanowires in group 61 (block 222) and by removing layer 90 (block 224). Method 200 may continue by forming nitrided surfaces 95 upon the nanowires 60 in group 61 (block 226) and removing the oxidized surfaces 85 of the nanowires in group 62 (block 228).

Method 200 may continue by forming epitaxy 100 upon nanowire 60 sidewalls of group 62 (block 230). Epitaxy 100 may be a <111> bounded diamond shaped epitaxy structure surrounding and merging the nanowires 60 of group 62. Method 200 may continue by forming layer 110 to a thickness to cover epitaxy 100 (block 232). In the present stage of fabrication, layer 110 need not cover the nanowires 60 in group 61.

Method 200 may continue by removing the nitrided surfaces 95 from the nanowires 60 of group 61 (block 234). Method 200 may continue by forming epitaxy 120 upon nanowire 60 sidewalls of group 61 (block 236). Epitaxy 120 may be a <111> bounded diamond shaped epitaxy structure surrounding and merging the nanowires 60 of group 61.

Method 200 may continue by forming layer 130 upon layer 110 such that the top of layer 130 is coplanar with the top of gate structure 50 (block 238).

In certain embodiments, method 200 may continue with further semiconductor fabrication techniques that may add or remove components, materials, etc. in further front end of line, middle end of line, or back end of line fabrication steps to form a semiconductor device. For example, if gate structure 50 is a dummy gate, structure 10 may undergo subsequent "gate last" fabrication processes. Method 200 ends at block 240.

Figure 20:
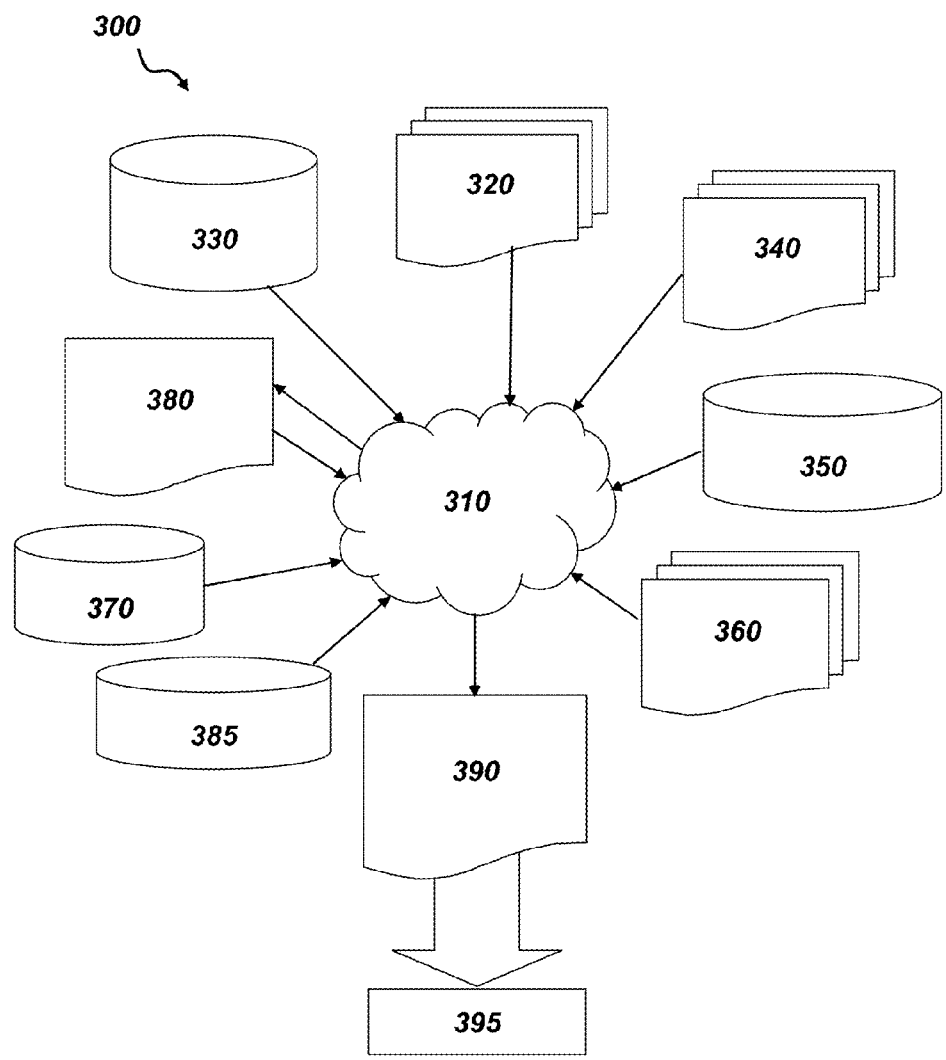
FIG. 20 depicts a flow diagram of a design process used in stacked semiconductor design, manufacture, and/or test, in accordance with various embodiments of the present invention.

Referring now to FIG. 20, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-18.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 19 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-18. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-18 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-18. In one embodiment, design structure 390 may comprise a compiled, executable HDL simulation model that functionally simulates the devices shown in FIGS. 1-18.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-18. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A stacked semiconductor device fabrication process comprising:
    forming a lattice-fin upon a semiconductor substrate;
    forming a gate upon the semiconductor substrate surrounding a portion of the lattice-fin;
    forming vertically stacked self-aligned nanowires by selectively removing a plurality of layers from the lattice fin;
    forming first epitaxy upon sidewalls of a plurality of vertically stacked self-aligned nanowires in a first nanowire group, the first epitaxy merging the first nanowire group in source and drain regions of the stacked semiconductor device, and;
    forming second epitaxy upon sidewalls of a plurality of nanowires in a second nanowire group, the second epitaxy merging the plurality of nanowires in the second nanowire group in source and drain regions of the stacked semiconductor device.

2. The semiconductor device fabrication process of claim 1, further comprising:
    forming a super-lattice upon the semiconductor substrate, the super-lattice comprising a first layered lattice formed upon the semiconductor substrate, an inter-lattice material formed upon the first layered lattice, and a second layered lattice formed upon the inter-lattice material.

3. The semiconductor device fabrication process of claim 2, wherein the first layered lattice comprises alternating first semiconductor layers and second semiconductor layers and wherein the second layered lattice comprises oppositely orientated alternating first semiconductor layers and second semiconductor layers.

4. The semiconductor device fabrication process of claim 3, wherein the lattice-fin is formed from the super-lattice and wherein the stacked self aligned nanowires are formed by removing the first semiconductor layers.

5. The semiconductor device fabrication process of claim 3, wherein the lattice-fin is formed from the super-lattice and wherein the stacked self aligned nanowires are formed by removing the second semiconductor layers.

6. The semiconductor device fabrication process of claim 1, wherein the merged first nanowire group forms a first field effect transistor (FET) structure of opposite polarity relative to a second FET structure formed from the merged second nanowire group.

7. The semiconductor device fabrication process of claim 1, wherein the gate is a dummy gate structure.

* * * * *